United States Patent [19]

Davis et al.

[11] Patent Number: 4,518,874
[45] Date of Patent: May 21, 1985

[54] CASCODED PLA ARRAY

[75] Inventors: James W. Davis, Boca Raton, Fla.; Frank D. Jones, Wallkill, N.Y.

[73] Assignee: International Business Machines Corporation, Armonk, N.Y.

[21] Appl. No.: 572,322

[22] Filed: Jan. 20, 1984

Related U.S. Application Data

[63] Continuation of Ser. No. 236,390, Feb. 18, 1981, abandoned, which is a continuation-in-part of Ser. No. 22,589, Mar. 21, 1979, abandoned.

[51] Int. Cl.$^3$ ............... H03K 19/086; H03K 19/092; H03K 19/177; H01L 27/10
[52] U.S. Cl. .................... 307/467; 307/455; 307/264; 357/45; 357/48
[58] Field of Search ............ 307/465, 467, 455; 357/45, 48, 46; 307/264

[56] References Cited

U.S. PATENT DOCUMENTS

| | | | |
|---|---|---|---|
| 3,539,824 | 11/1970 | Yu et al. | |
| 3,735,358 | 5/1973 | Ho | 357/45 |
| 3,784,976 | 1/1974 | Ho | 357/45 |
| 3,906,212 | 9/1975 | Poguntke | 307/467 |
| 3,925,684 | 12/1975 | Gaskill, Jr. et al. | |
| 3,956,641 | 5/1976 | Berger et al. | 357/46 |
| 4,212,026 | 7/1980 | Balasubramanian et al. | 357/45 |

FOREIGN PATENT DOCUMENTS

EP17668 10/1980 European Pat. Off.

OTHER PUBLICATIONS

Cavaliere et al, IBM Tech. Discl. Bull. vol. 18, No. 10, Mar. 1976, pp. 3245–3248.
RCA COS/MOS Digital Integrated Circuits, Data Book SSD-203 (RCA, Somerville, NJ, 1972), p. 83.

Primary Examiner—William D. Larkins
Attorney, Agent, or Firm—John E. Hoel

[57] ABSTRACT

A bipolar transistor integrated circuit PLA is disclosed. The array includes a first and second mutually isolated epitaxial regions in a semiconductor substrate. A plurality of common collector bipolar transistors are formed in the first epitaxial region with selected ones of the plurality having their emitters connected in common to a first current source. A second plurality of common collector bipolar transistors in the second epitaxial region have the emitters of selected ones of the second plurality connected in common to the first epitaxial region. The bases of the corresponding pairs of transistors from the first and second epitaxial region are connected to an input signal source. The second epitaxial region is connected to an output node. In this manner, a cascode connected PLA is formed which eliminates the need for surplus current sources required in the prior art. The dot OR formed by the circuit effectively merges the prior art OR array with the search array.

14 Claims, 17 Drawing Figures

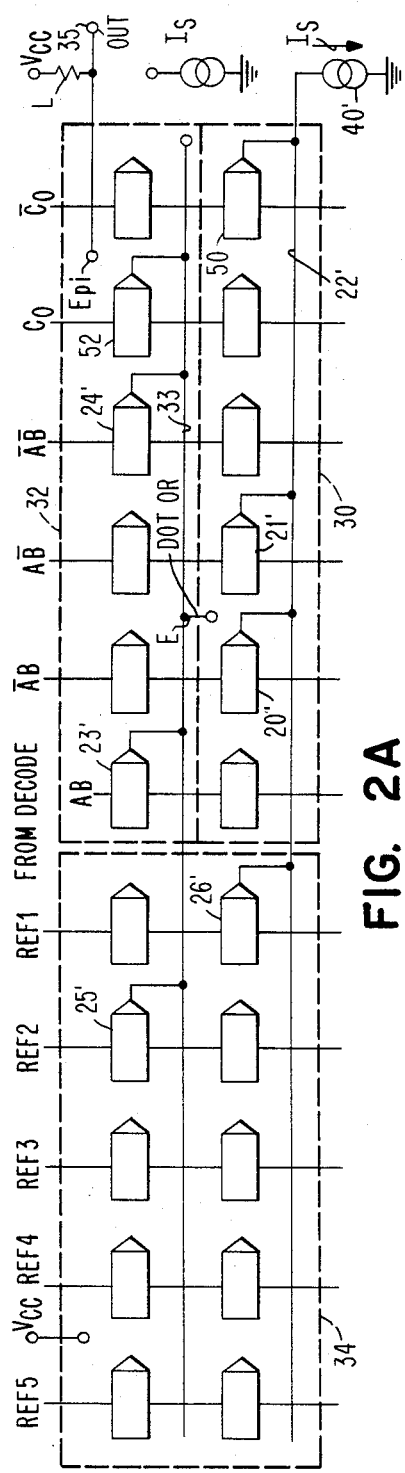
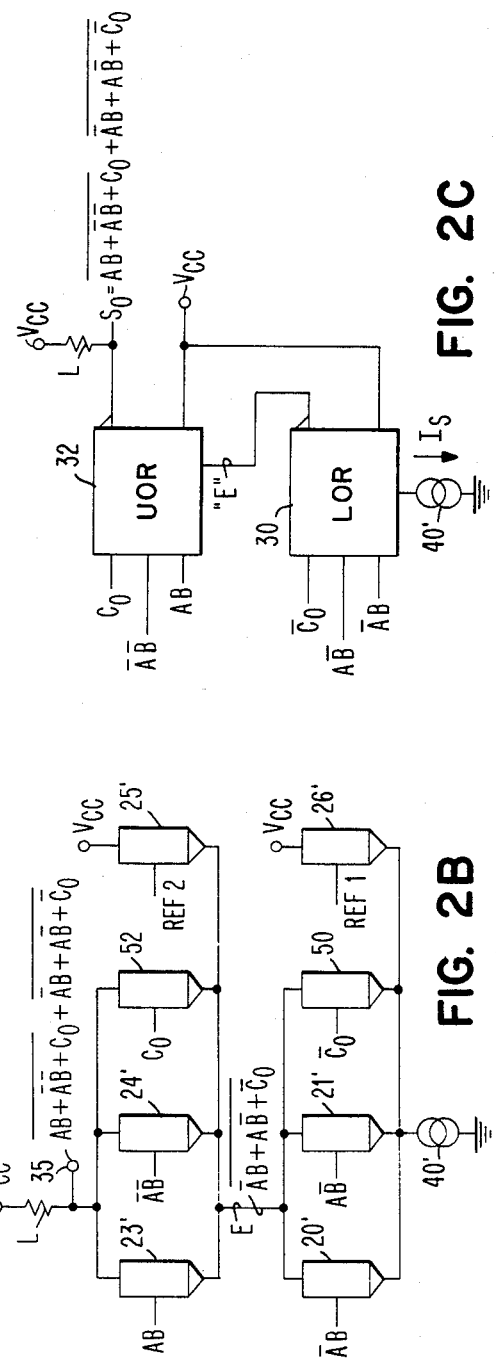
FIG. 2A
FIG. 2B
FIG. 2C

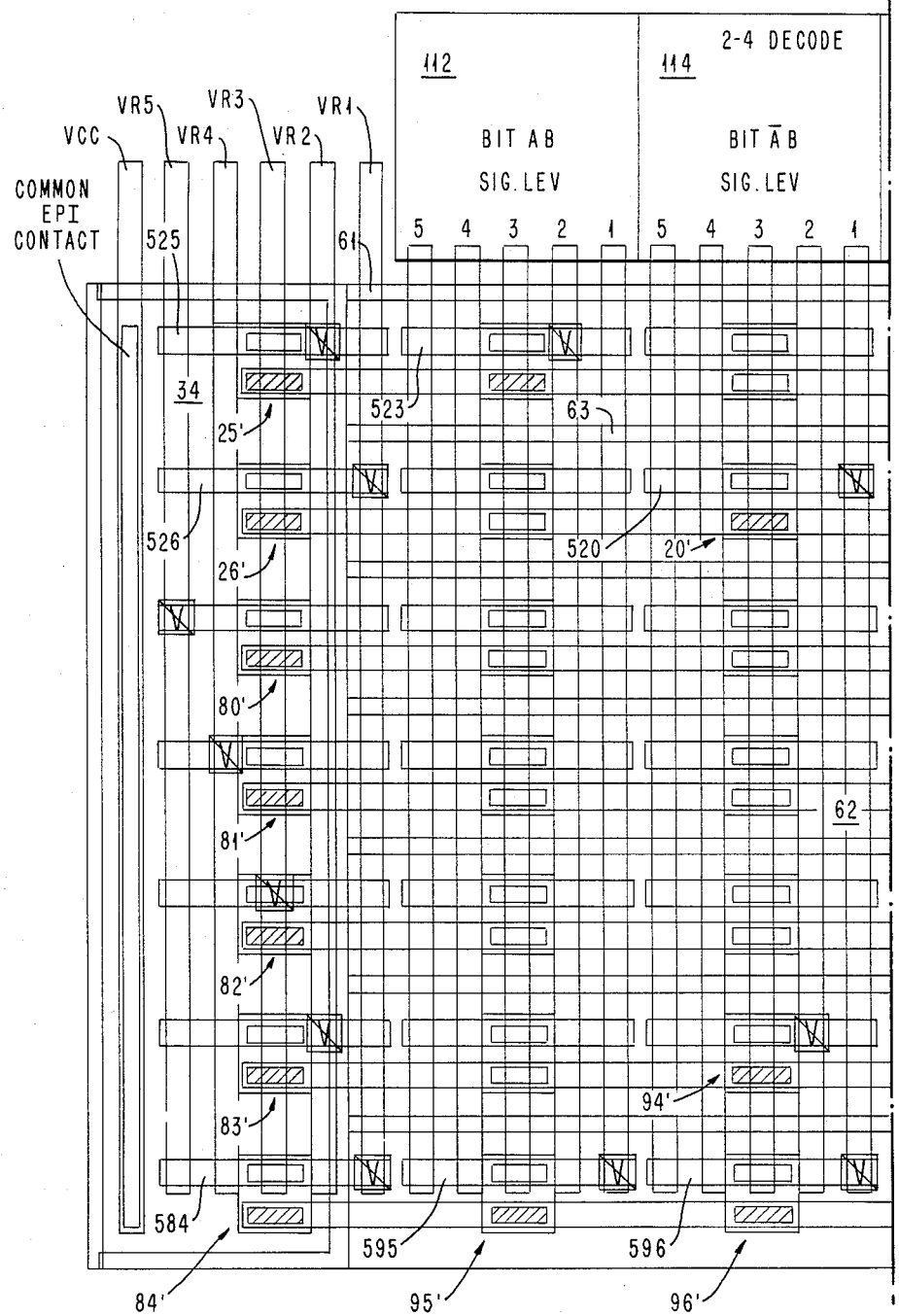

FIG.4C (COMPOSITE)
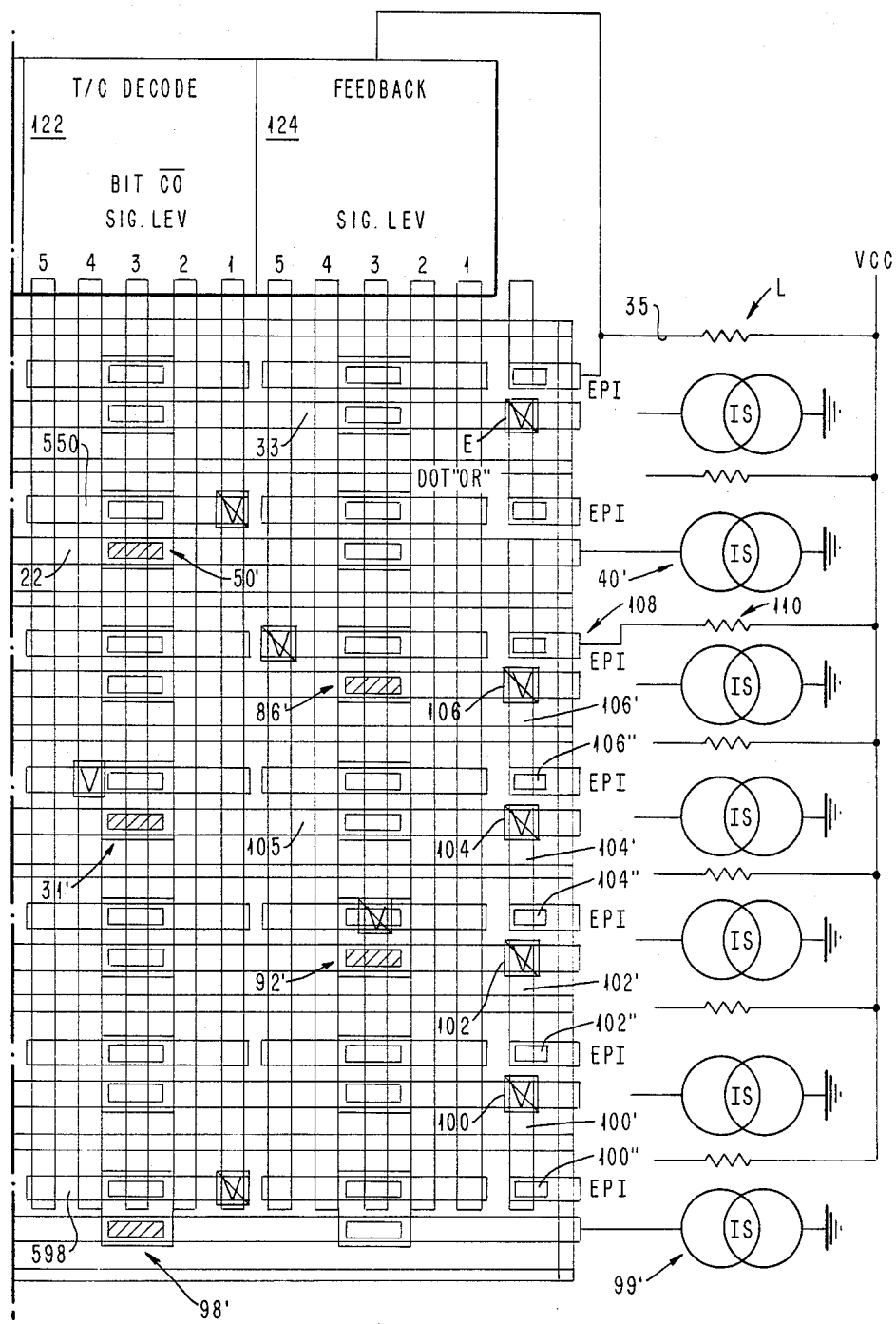

FIG. 4B (COMPOSITE)
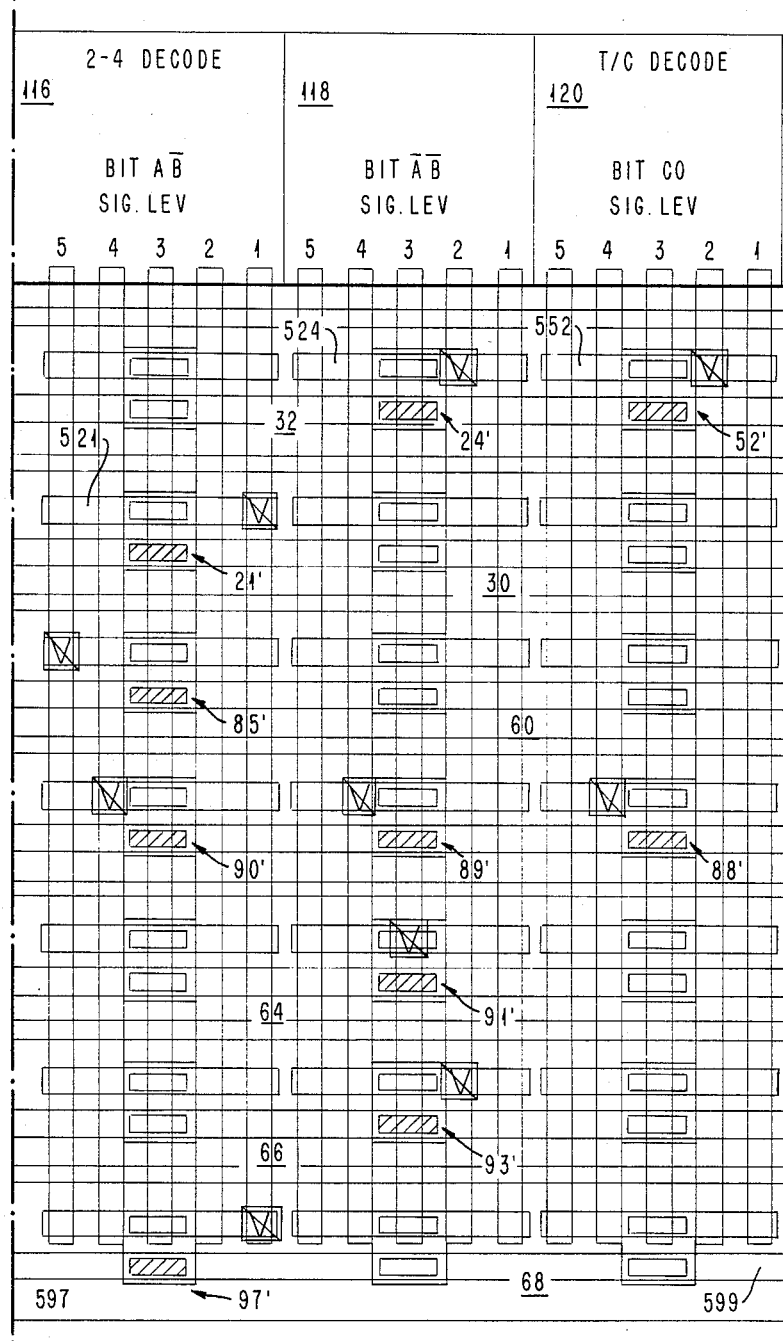

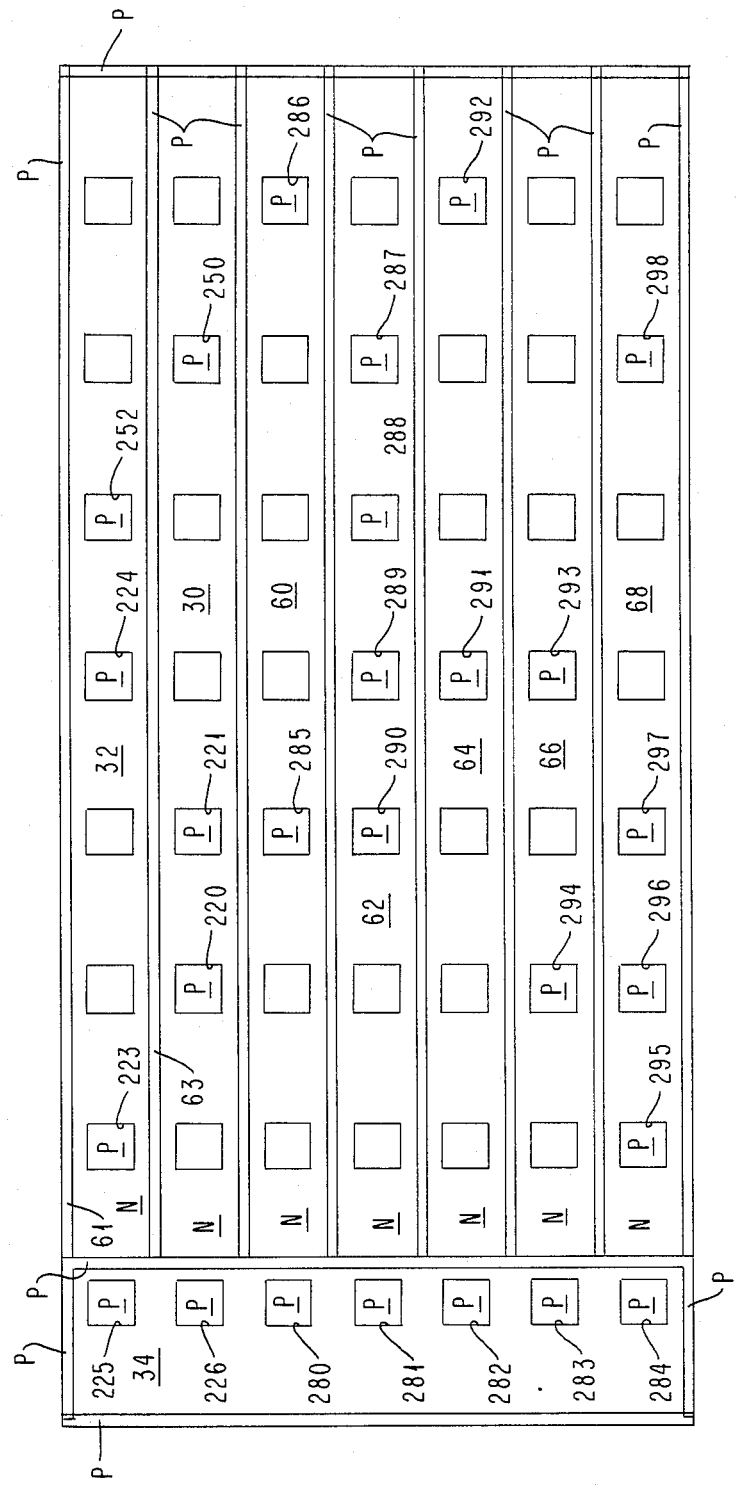
FIG. 5    P-TYPE DIFFUSIONS IN N-TYPE SEMICONDUCTOR EPI LAYER

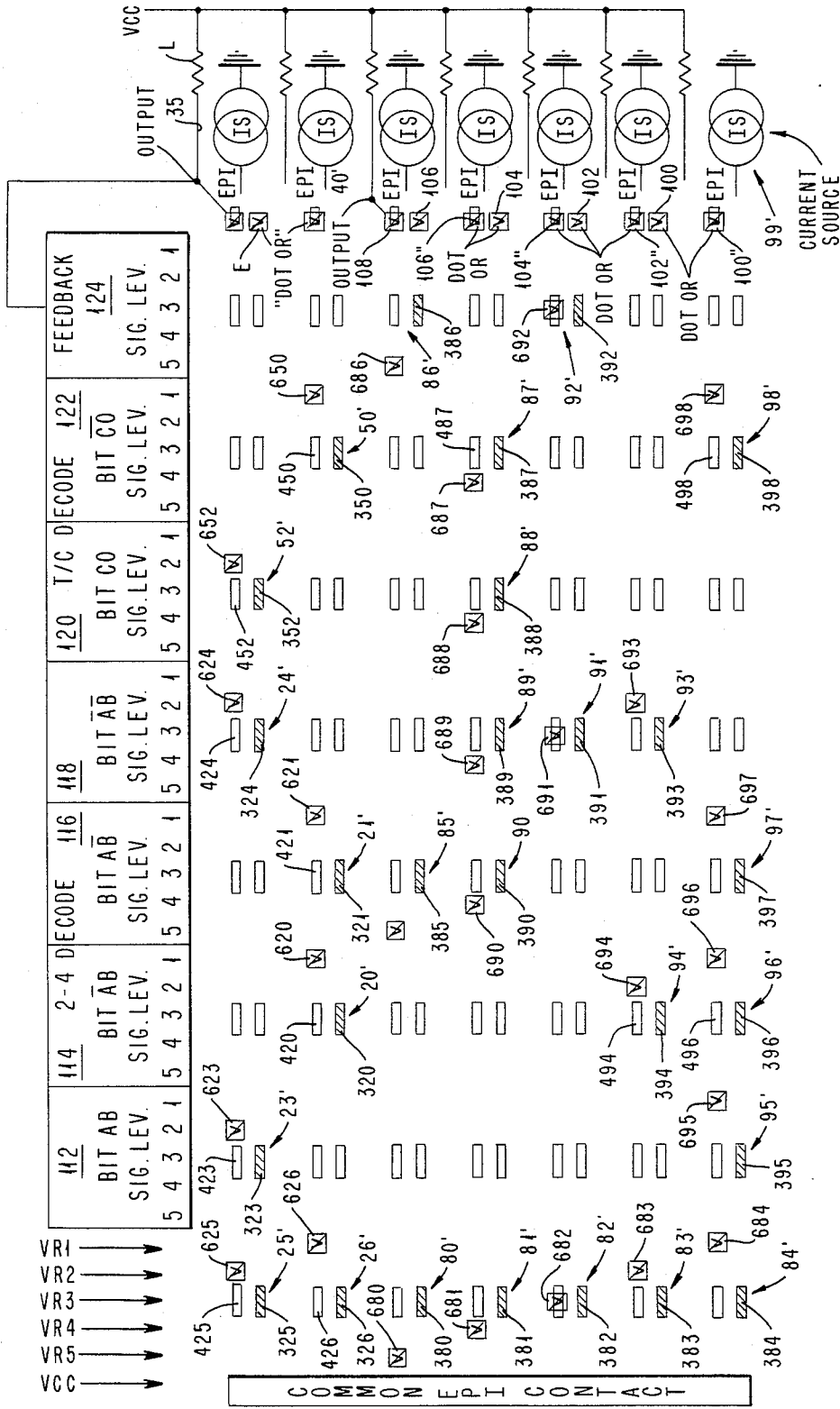
FIG.6   N-TYPE DIFFUSIONS AND VIA INTERCONNECTIONS

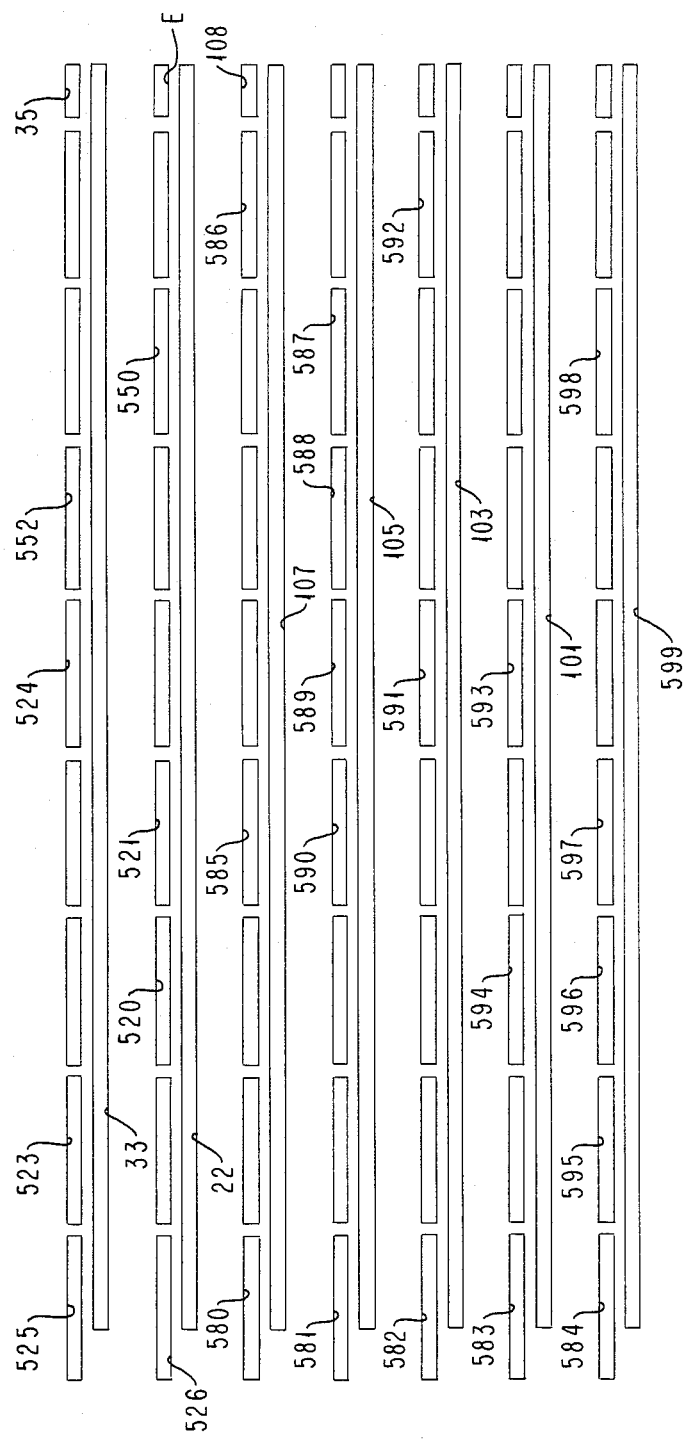
FIG. 7  INTERCONNECTION LINES (LOWER LEVEL)

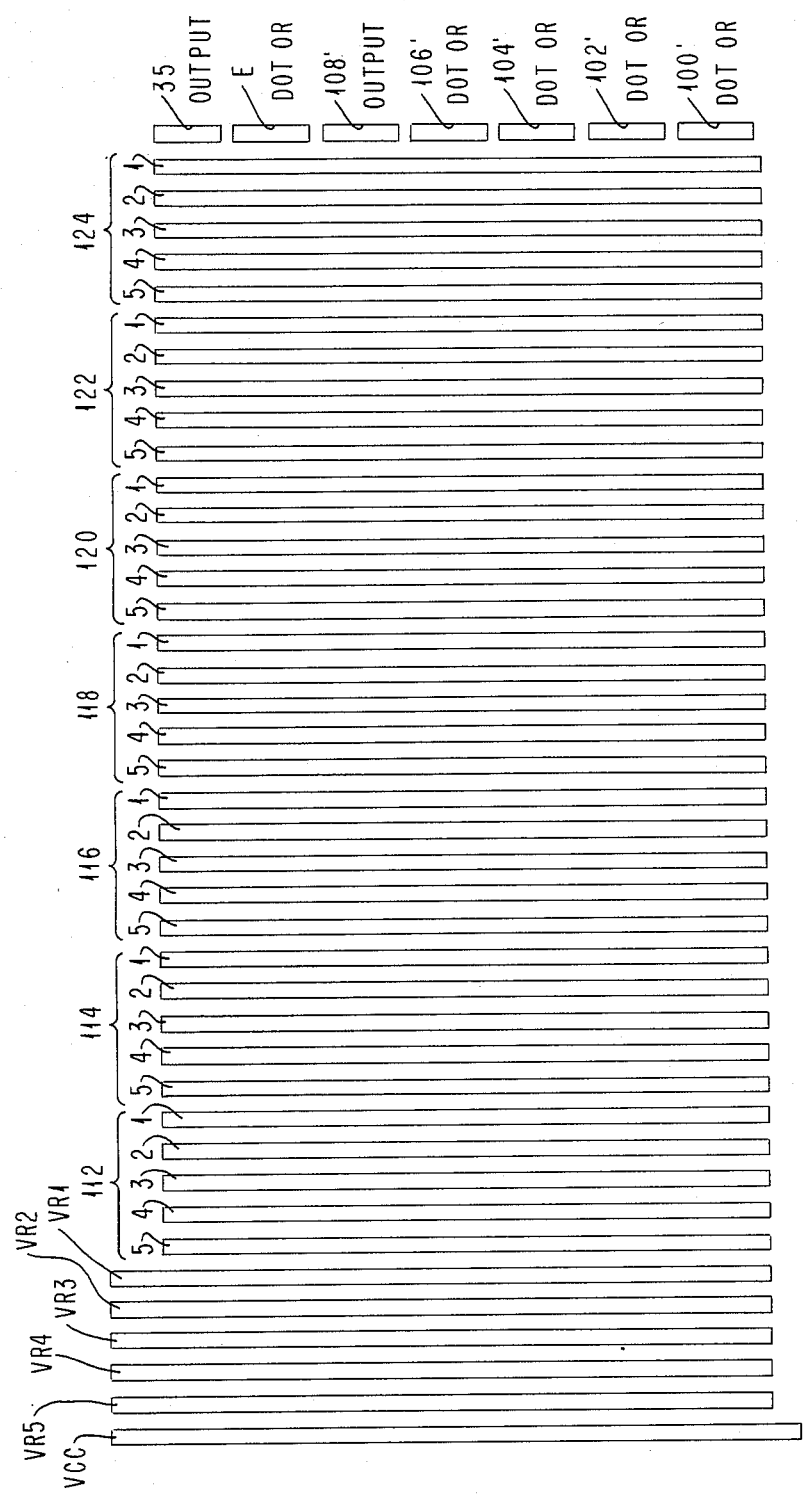

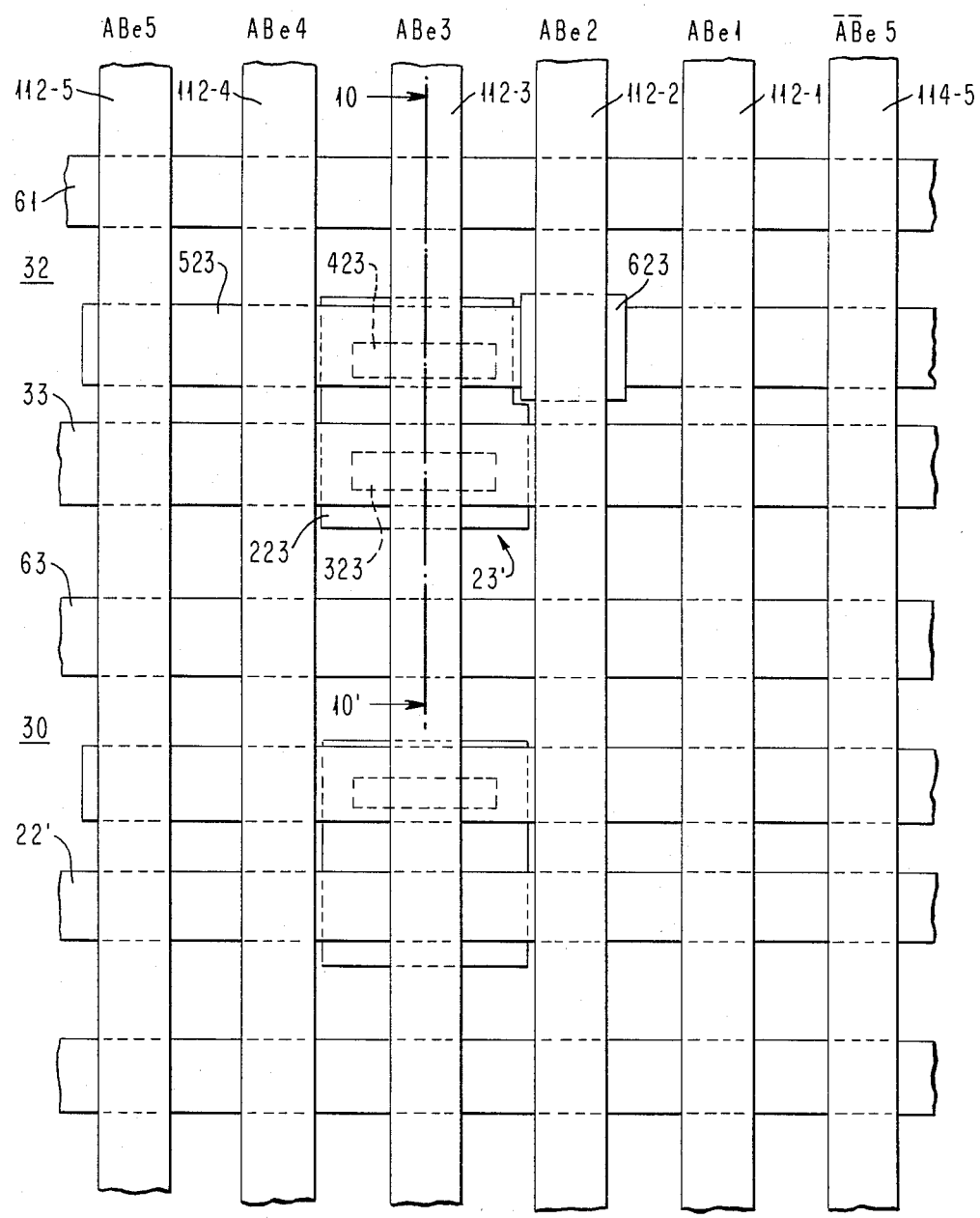
FIG. 9  2-4 DECODE OUTPUT TOPOLOGICAL BUS, TX 23' PERSONALIZED WITH INPUT TERM AB AT SIGNAL LEVEL 2.

TOPOLOGY PROFILE
SEC. 10-10'
(OF FIG. 9)

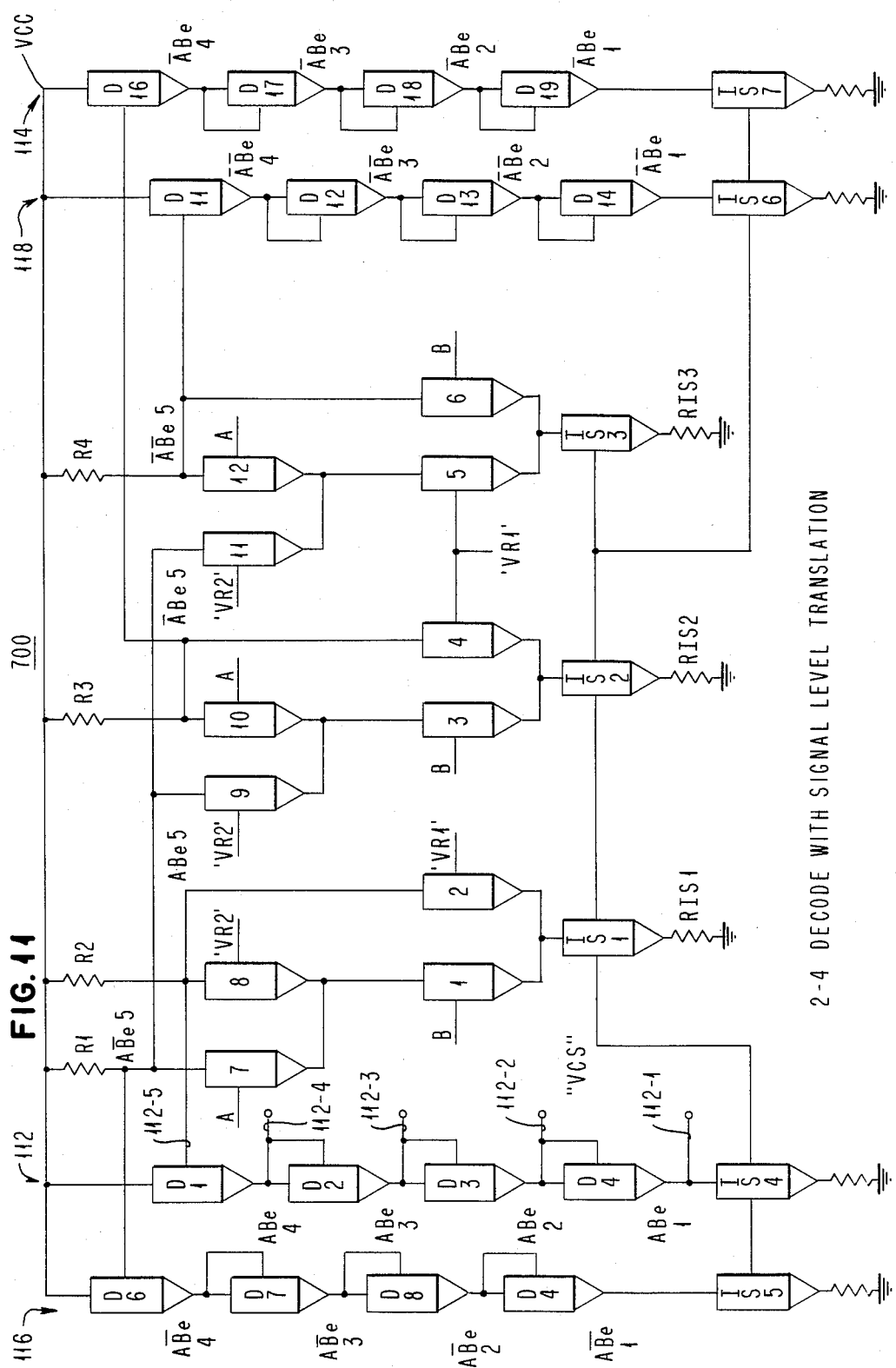
FIG. 11  2-4 DECODE WITH SIGNAL LEVEL TRANSLATION

CASCODED PLA ARRAY

This is a continuation of U.S. patent application Ser. No. 236,390 filed Feb. 18, 1981, now abandoned, which was a continuation-in-part of U.S. patent application Ser. No. 22,589, filed Mar. 21, 1979, now abandoned.

FIELD OF THE INVENTION

The invention disclosed broadly relates to semi-conductor devices and more particularly relates to bipolar PLAs.

BACKGROUND OF THE INVENTION

FIG. 1A illustrates a prior art bipolar PLA circuit where the search array 1 has each OR block 2 and 8 connected to its own respective current source 40 or 41. In the OR block 2, shown in the logic diagram of FIG. 1B, the array transistors 20 and 21 are connected in emitter coupled logic configuration with the transistor 26, whose collector is the output node for that OR block. The OR block output must be inverted by the interter 4 which employs its own current source 42, and the inverted output OR'ed with the corresponding output of the OR block 8. This prior art circuit shown in FIG. 1A requires five current sources 40, 41, 42, 43 and 44, requires two inverters 4 and 10 and requires a separate OR array 6 to accomplish the PLA function. It is to be noted that the epitaxial tub which serves as a common collector for the OR block 2 is connected to the collector voltage VCC, and the collector of the reference transistor 26 is connected through a resistor to the collector voltage VCC.

OBJECTS OF THE INVENTION

It is therefore an object of the invention to reduce the number of current sources required in a bipolar PLA circuit.

It is still another object of the invention to improve the speed/power product for a bipolar PLA circuit.

It is yet a further object of the invention to reduce the overall area occupied by a bipolar PLA circuit for a given function to be performed.

SUMMARY OF THE INVENTION

These and other objects, features, and advantages of the invention are accomplished by the cascoded PLA disclosed herein. A bipolar transistor integrated circuit PLA is disclosed. The array includes first and second mutually isolated epitaxial regions in a semi-conductor substrate. A plurality of common collector bipolar transistors are formed in the first epitaxial region with selected ones of the plurality having their emitters connected in common to a first current source. A second plurality of common collector bipolar transistors in the second epitaxial region have the emitters of selected ones of the second plurality connected in common to the first epitaxial region. The bases of the corresponding pairs of transistors from the first and second epitaxial region are connected to an input signal source. The second epitaxial region is connected to an output node. In this manner, a cascode connected PLA is formed which eliminates the need for surplus current sources required in the prior art. The dot OR formed by the circuit effectively merges the prior art OR array with the search array.

DESCRIPTION OF THE FIGURES

These and other objects, features, and advantages of the invention can be more fully appreciated with reference to the accompanying figures.

FIG. 2A is a schematic circuit diagram of the cascoded PLA invention.

FIG. 2B is a circuit schematic diagram which more clearly illustrates the emitter coupled logic configuration of the circuit shown in FIG. 2A.

FIG. 2C is a logic block diagram of the circuit shown in FIG. 2A.

FIG. 4 is a composite plan view of the structured cascoded current switch PLA layout.

FIG. 5 is a plan view of the lowest layer of the composite layout of FIG. 4, showing the isolated epitaxial N-type layers which are separated by P-type isolation diffusions and in which are distributed the P-type base regions for the NPN transistors.

FIG. 6 is a plan view of a second layer in the composite of FIG. 4, illustrating the contact holes for the base and the emitter for each of the bipolar transistors, and further showing an additional higher level locating the via hole connection between the programmable metal base connection and the input signal level bus for each respective bipolar transistor.

FIG. 7 is a plan view of a higher level in the composite of FIG. 4, illustrating metal innerconnection lines, showing the programmable metal base connections and the common emitter bit lines for the bipolar transistors.

FIG. 8 is a plan view of the top level of FIG. 4, illustrating the input signal level bus metal lines for the bipolar transistors of FIG. 4.

FIG. 9 is a detailed plan view of the composite layout for the device 23'.

FIG. 11 is a circuit schematic diagram of the two-four bit decode circuit 700 which provides a two-bit partitioned output for logical inputs A and B and which provides each of the four logical outputs with five different voltage levels.

DISCUSSION OF THE PREFERRED EMBODIMENT

Figure 1A:
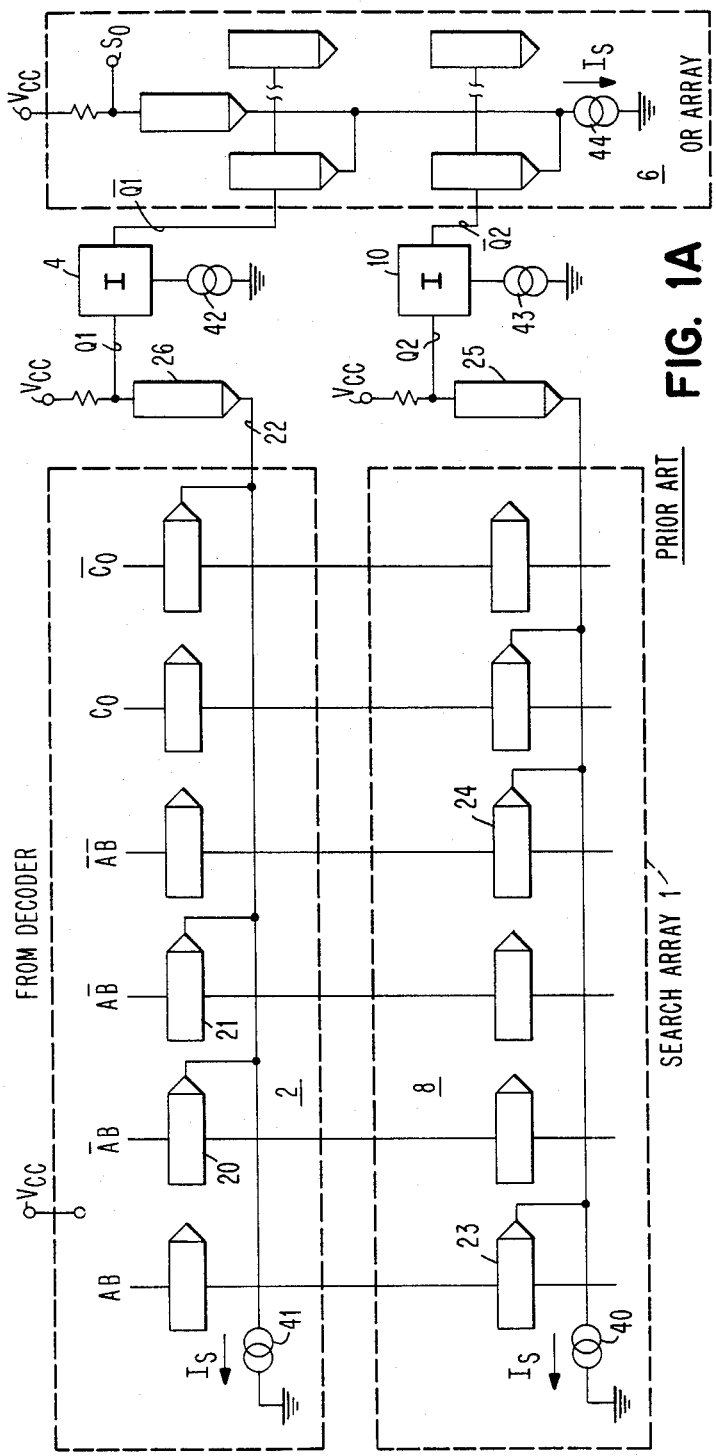
FIG. 1A is an illustration of a prior art bipolar PLA circuit.
Figure 1B:
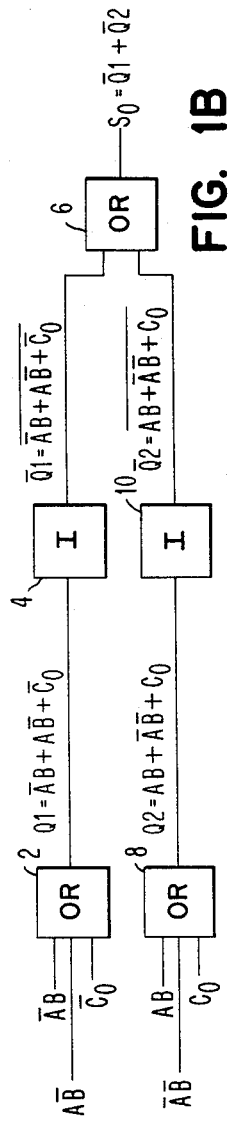
FIG. 1B is a logic diagram of the circuit shown in FIG. 1A.

The cascoded PLA invention is shown in FIGS. 2A, 2B, and 2C. As may be seen in FIG. 2A, the transistors accomplishing the logic functions corresponding to those carried out with the prior art circuit shown in FIG. 1A are labeled with primed numbers with respect to those numbered transistors in FIG. 1A. In FIG. 2A, each OR block 30 and 32 is isolated in its own epitaxial tub serving as the common collector for the array transistors. In the OR block 32, for example, the emitters of the bipolar transistors are selectively connected to an emitter line 33 which may serve as the current source connection for the OR block. More importantly, the emitter line 33 may be cascode connected to the common collector tub of the OR block 30 as is shown in FIG. 2B so that the logical function provided by the OR array 32 and that performed by the OR array 30 are to the commonly connected emitters of the devices 91' and 92' in the third word line of FIG. 3.

Figure 3:
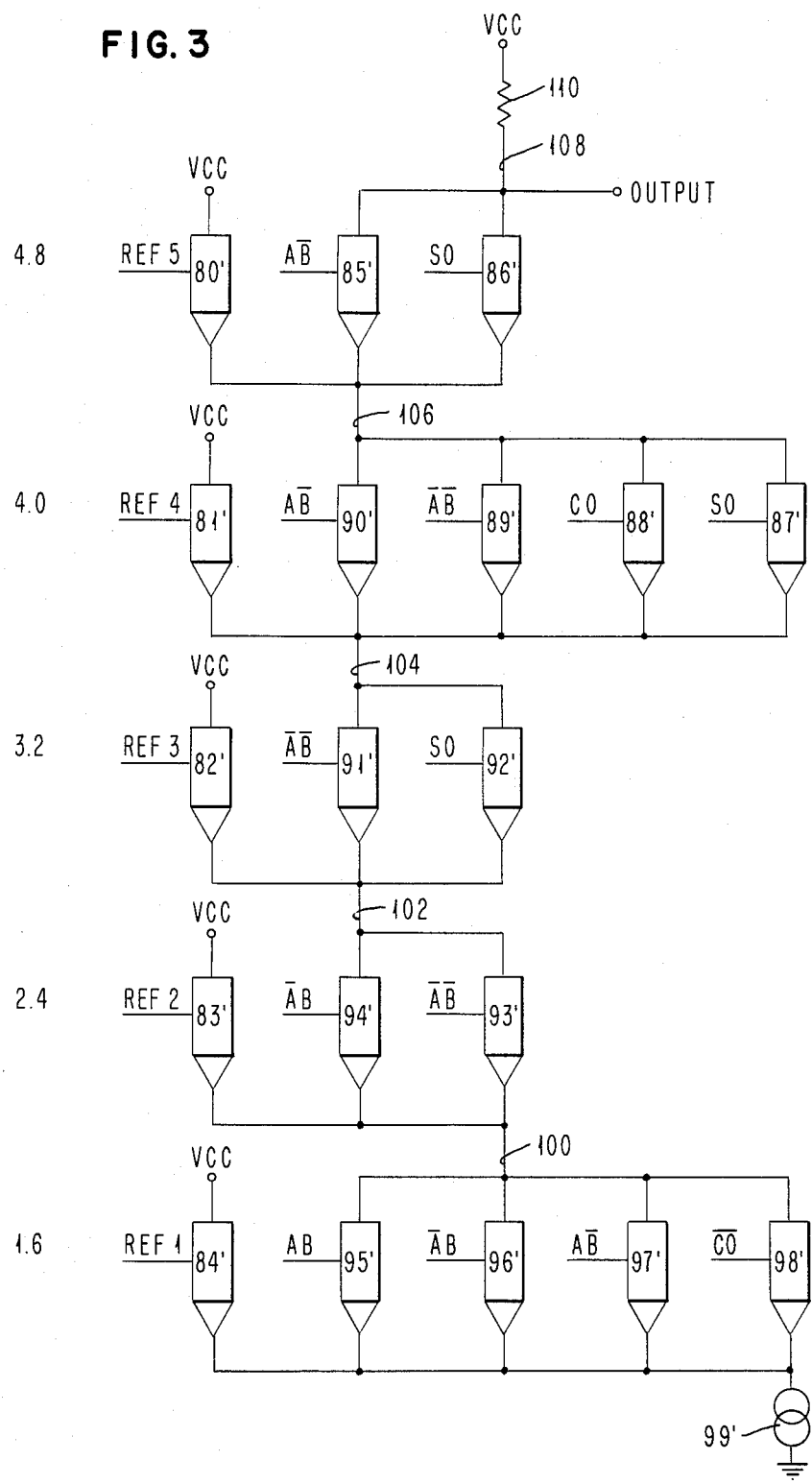
FIG. 3 is a circuit schematic diagram of an expanded cascoded PLA array having five word lines.

The third word line of FIG. 3 has the transistor emitters connected in common to the emitter of the reference device 82' whose base is connected to the reference voltage REF3 of approximately 3.2 volts. The commonly connected collectors of the devices 91' and 92' are connected by means of the dot OR connection 104 to the commonly connected emitters of the devices 90', 89' 88' and 87' in the fourth word line.

The commonly connected emitters of the logic devices in the fourth word line are connected to the emitter of the reference device 81' whose base is connected to the reference voltage REF4 of approximately four volts. The commonly connected collectors of the logic devices in the fourth word line are connected through the dot OR connection 106 to the commonly connected emitters of the logic devices 85' and 86' of the fifth word line of FIG. 3.

The commonly connected emitters of the logic devices in the fifth word line are connected to the emitter of the reference device 80' whose base is connected to the reference voltage REF5 of approximately 4.8 volts. The commonly connected collectors of the devices 85' and 86' are connected via the output terminal 108, through the load resistor 110 to the collector potential $V_{CC}$. Thus the output of the cascoded PLA array shown in FIG. 3 is at the terminal 108 and represents the logical combination of the binary inputs to the devices in the five respective word lines of FIG. 3, in a manner similar to that produced for the two respective word lines of FIG. 2B, as described above.

A second five level cascoded PLA array, similar to the array shown in FIG. 3, can have one of the logic transistors in its fifth level with its base connected to the output terminal 108 of the first circuit of FIG. 3. In this manner, the five word line level cascoded PLA array shown in FIG. 3 can be expanded into an arbitrary number of multiples of five levels of PLA logic by merely taking the output such as 108 of a preceding cascoded PLA array and applying it as the input to a fifth level logic transistor such as 86' in the next five level cascoded PLA array. In other words, the objective can be to take a function produced in a single five level gate and provide a PLA output consisting of more than the five levels (or five word lines) by introducing that output as a word line itself to a next gate.

Figure 10:
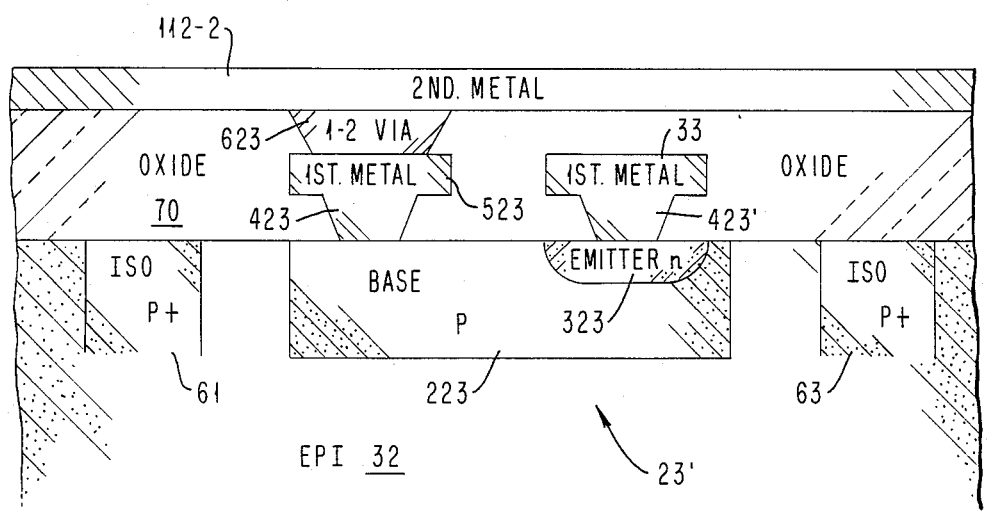
FIG. 10 is a cross-sectional diagram along the section lines 10—10' of FIG. 9.

The structured cascoded current switch PLA layout shown in FIGS. 4 through 8 can be better understood with reference to the detailed view of the layout for the transistor 23' shown in FIG. 9 and the cross-section view of transistor 23' shown in FIG. 10. The epitaxial layer 32 has an N-type conductivity and is formed within the P+ type isolation regions 61 and 63. A P-type base diffusion 223 is formed in the epitaxial layer 32 and then the oxide layer 70 is formed over the entire surface of the epitaxial layer 32.

The silicon dioxide layer 70 then has the contact hole 423' selectively formed therein and this is followed by the diffusion or ion implantation of the N-type emitter 323 in the base region 223. The formation of an N-type emitter for a particular transistor depends upon whether that transistor is to participate in the cascoded PLA array. This selected formation of emitters is part of the bit personalization for a cascoded PLA array for a particular word line. For example, it can be seen from FIG. 5 that the first word line with epitaxial tub 32 has seven base diffusions, however only three of those base diffusions, namely 223, 224 and 252 will be employed in the first word line. Thus, as is seen in FIG. 6 only three of the possible seven emitter sites for the epitaxial tub 32 in the first word line will be actually formed, namely the emitters 323, 324 and 352. The emitter sites for the other four base diffusions in the first epitaxial tub 32 will not be formed for this particular complex logical function.

Returning now to FIG. 10, the next step in the formation of the transistor 23' is the formation of the base contact opening 423 through the oxide layer 70. This is then followed by the deposition of the first level metal which is etched into the horizontal array of programmable metal base connections 525, 523, etc. on FIG. 7 and the horizontal array of common emitter bit lines 33, 22', 599, etc. Each transistor, for example transistor 23', has its corresponding base electrically connected to its corresponding programmable metal base connection. For example, the base 223 is connected by virtue of the via hole 423 to the programmable metal base connection 523. However, only those transistors having an emitter in the base region will have an open emitter via hole which is connected to its corresponding common emitter bit line. For example, in FIG. 10, the transistor 23' has its emitter 323 connected through its via hole 423' to the common emitter bit line 33. However, there will be no corresponding emitter via hole for those transistors in any word line which do not participate in the complex logical functions, and therefore the common emitter bit line will not be connected to such an unused transistor.

As was mentioned above, all of those transistors in the cascoded PLA array which will participate in the complex logical function have emitters such as 323 formed in their respective base regions and respectively connected to their corresponding common emitter bit lines such as 33. That is a first level of programmed or selectible personalization. A second level of programmed or selectible personalization is the connection of the programmable metal base connection such as 523 for any one transistor to one of the five input signal level buses such as 112-2 shown in FIG. 8 and which are connected to a corresponding one of five voltage levels of the two-four decode circuit 700. This connection is achieved by means of a via hole connection such as 623 shown for transistor 23' in FIG. 10. The via hole connection 623 connects the programmable metal base connection 523 to the input signal level bus 112-2 of FIG. 8 so as to supply a signal voltage level whose binary voltage swing is centered about the voltage value of reference voltage REF2.

The reference transistor 25' whose emitter is connected in common to the emitters of transistors 23', 24' and 52 in the first word line of FIG. 4, is formed, along with other reference transistors for other word lines, in the epitaxial tub 34 of FIG. 5. In particular, the reference transistor 25' is formed in the N-type epitaxial tub 34 by means of the P-type base diffusion 225 of FIG. 5 which has formed therein the N-type emitter diffusion 325 of FIG. 6. The base 225 is connected through via hole 425 and programmable metal base connected 525 to the via contact 625 and to the vertical metal line VR2 shown in FIG. 8, which supplies the REF2 voltage to the base of reference transistor 225. The reference transistor 225 is formed in a manner similar to the logic transistor 23', as described above.

Reference to the cross-sectional view of device 23' in FIG. 10 and its detailed view from the top in FIG. 9 will enhance the understanding of the formation of all of the bipolar devices shown in the cascoded PLA array of FIG. 4. As can be seen from inspection of FIG. 4, the first (or top) and second (or second from top) word lines embody the complex logical function shown schematically in FIG. 2B and the third (or third from top), fourth, fifth, sixth and seventh (or bottom) word lines embody the complex logical function shown in FIG. 3.

The utility of the structural cascoded current switch PLA layout can be further appreciated with reference to how different transistors in a single column can be connected to different input signal level buses for achieving the logic functions to be performed by different horizontal word lines. For example, the devices 20', 94' and 96' are each members of separate respective word lines and yet each are juxtaposed into a single vertical column, as can be seen with reference to FIG. 4. Each of these three transistors has an emitter formed and connected by virtue of its respective common emitter bit line to the emitter of a corresponding reference transistor. For example, the emitter 320 of transistor 20' is connected to the emitter 326 of the reference transistor 26', whose base is connected by via contact 626 to reference voltage VR1 of 1.6 volts. The emitter 394 of the transistor 94' is connected to the emitter of transistor 83', whose base is connected to the reference voltage VR2 of 2.4 volts. And the emitter 396 of the transistor 96' is connected to the emitter of the reference transistor 84', whose base is connected to the reference voltage VR1 having a magnitude of 1.6 volts. It is to be noted in this instance that both the base of reference transistor 26' and the base of reference transistor 84' are each respectively connected to the vertical voltage line VR1 through their respective via holes.

With respect to the logic devices 20', 94' and 96', it is to be noted that the logic devices 20' and 96' have their respective bases connected by virtue of their respective via holes 620 and 696 to the input signal level bus 114-1. However, since the transistor 94' has its emitter connected to the emitter of reference voltage transistor 83' whose base is connected to VR2, the programmable metal base connection for the transistor 94' is connected by means of the via connection 694 to the input signal level bus 114-2 having binary voltage swings which are centered about 2.4 volts, as opposed to the binary voltage swings on the input signal level bus 114-1 which are centered about 1.6 volts. Thus it is seen that bipolar transistors which are vertically juxtaposed but are located in separate horizontal word lines, can have their bases respectively connected to different input signal level buses whose signal voltages correspond to the respective reference voltages input to the bases of their respective reference devices whose emitters are connected in common to the emitters of the transistors in that respective word line.

Reference is now made to FIG. 11 which illustrates a circuit schematic diagram of a two-four decode circuit wherein the binary values for A and B are input to the circuit and the circuit provides the four-bit partitioned logical expressions AB, $\overline{A}$B, A$\overline{B}$ and $\overline{A}$ $\overline{B}$ with each represented at the five different signal levels described above. For example, the circuit portion 112 outputs the logical value of AB centered about the voltage REF1=VR1=1.6 volts on line 112-1. The logical value of AB centered about the voltage REF2=VR2=2.4 volts is output on line 112-2. The logical value of AB centered about the voltage REF3=VR3=3.2 volts is output on line 112-3. The logical value of AB centered about the voltage REF4=VR4=4.0 volts is output on line 112-4. And the logical value of AB centered about the voltages REF5=VR5=4.8 volts is output on line 112-5. Portion 114 of circuit 700 produces $\overline{A}$B at five voltage levels in a similar manner. Portion 116 of circuit 700 produces A$\overline{B}$ at five voltage levels in a similar manner. And portion 118 of circuit 700 produces $\overline{A}$ $\overline{B}$ at five voltage levels in a similar manner.

The integrated circuit structure in which the cascoded PLA array is embodied in FIGS. 4 through 8, can be described as follows. In FIG. 5, a plurality of at least N=5 horizontal isolation regions 60, 62, 64, 66 and 68 of n-type conductivity, each corresponding to a program logic array word line, are formed in a semiconductor substrate, and arranged into vertically juxtaposed horizontal rows of a first periodicity.

A first plurality of base regions 285 through 298 of p-type second conductivity type, are arranged into N=5 horizontal rows of the first periodicity and N=7 columns of a second periodicity, with each row of base regions formed in one of the plurality of horizontal isolation regions 60, 62, 64, 66 or 68.

A vertical isolation region 34 of n-type conductivity is formed in the semiconductor substrate, oriented vertically, and juxtaposed with the left-most vertical sides of the plurality of horizontal isolation regions 60, 62, 64, 66 and 68.

A second plurality of at least N=5 base regions 280 through 284, of the p-type conductivity, are each juxtaposed with a respective one of the plurality of horizontal isolation regions 60, 62, 64, 66 and 68, and arranged into a column, and formed in the vertical isolation region 34, with each of the second plurality of base regions 280 through 284 being respectively electrically connected to one of N=5 reference voltages VR1 through VR5.

FIG. 6 shows a first plurality of emitter regions 385 through 398 of n-type conductivity, each selectively formed in a respective selected one of the first plurality of base regions 285 through 298.

A second plurality of emitter regions 380 through 384 of n-type conductivity, are each formed in a respective one of the second plurality of base regions 280 through 284.

FIG. 7 shows a plurality of horizontal, common emitter conducting lines 107 (including via connection 106), 105 (including via connection 104), 103 (including via connection 102), 101 (including via connection 100), and 599 which are formed at a first level above the substrate, each being juxtaposed with a respective one of the plurality of horizontal isolation regions 60, 62, 64, 66 or 68 and being electrically connected to a corresponding one of the second emitter regions 380 through 384 in a juxtaposed one of the second plurality of base regions 280 through 284, to each one of a subplurality of the first plurality of emitter regions 385 through 398 in the respective one of the plurality of horizontal isolation regions 60, 62, 64, 66 or 68.

For example, the top word line 60 of the complex logical function shown in FIG. 3, has a common emitter line 107 which is connected to the emitter 380 in the base 280 of the reference transistor 80' and is further connected to the emitter 385 in the logical transistor 85' and to the emitter 386 in the logical transistor 86'.

FIG. 7 further shows a plurality of horizontal, programmable base connection, conducting line segments 585 through 598 formed at the first level above the substrate, each being juxtaposed with and being electrically connected to a respective one of the first plurality of base regions 285 through 298.

FIG. 8 shows a plurality of M×N=35 vertical conducting lines formed at a second level above the first level above the substrate, each subplurality of N=5 adjacent ones of the vertical conducting lines being juxtaposed with one of the plurality of horizontal base connections 585 through 598 which are connected to ones of the first plurality of base connections arranged into one of the M=7 columns, each respective vertical line in each of the subplurality of vertical conducting lines being electrically connected to a logic signal source 700 providing logic signals which are referenced with respect to one of the N=5 reference voltages. The vertical conducting lines are numbered 112-1, 2, 3, 4, 5; 114-1, 2, 3, 4, 5; with a similar numbering for the group 116, 118, 120, 122 and 124.

The selected first base regions 285 through 298 each has its respective horizontal base connection 585 through 598 selectively electrically connected to that one of the N=5 juxtaposed vertical conducting lines 112-1, 2, 3, 4, 5, etc., whose logic signals correspond to that one of the N=5 reference voltages VR1 through VR5 which is connected to that one of the second plurality of base regions 280 through 284 which are juxtaposed therewith.

For example, for the transistor 85', the base connection 585 is connected to the vertical signal line 116-5 whose logical signal is referenced with respect to the reference voltage VR5. The emitter 385 of the transistor 85' is connected by the horizontal common emitter conducting line 107 to the emitter 380 of the reference transistor 80', whose base 280 is connected to the reference voltage VR5 through its base connection 580.

A first horizontal isolation region 60 is connected to the output terminal 108 and is further connected through the load device 110 to the collector voltage $V_{CC}$.

A second horizontal isolation region 62, which is adjacent to the first horizontal isolation region 60, is electrically connected through the via connection 106, as a logical DOT OR connection to become emitter conducting line 107 which is juxtaposed above the first horizontal isolation region 60.

The third horizontal isolation region 64 is electrically connected through the via connection 104, which is a logical DOT OR connection, to the common emitter conducting line 105 juxtaposed above the second horizontal isolation region 62.

The fourth horizontal isolation region 66 is electrically connected through the via connection 102, which is a logical DOT OR connection, to the common emitter conducting line 103 which is juxtaposed above the third horizontal isolation region 64.

The fifth horizontal isolation region 68 is electrically connected through the via connection 100, which is a logical DOT OR connection, to the common emitter conducting line 101 which is juxtaposed above the fourth horizontal isolation region 66.

The common emitter conducting line 599 which is juxtaposed with the fifth horizontal isolation region 68, is electrically connected to the current source 99.

In this manner, a bipolar transistor integrated circuit program logic array structure is formed which effectively merges the OR array with a search array of the prior art, by providing the DOT OR connection between adjacent word lines in the array.

As can be seen from FIGS. 4 through 8, the bases 280 through 284 of the reference voltage transistors 80' through 84', can be respectively connected to their corresponding reference voltages VR5 through VR1, respectively by means of the plurality of horizontal, programmable base connections 580 through 584, in a manner similar to the interconnection of the bipolar transistors 85 through 98, as discussed above.

With regard to the reference numerals for the elements of each of the npn bipolar transistors in FIGS. 4 through 10, a transistor "XX", such as transistor 23' will have its p-type base numbered "2XX,", such as the base 223 for transistor 23'; its n-type emitter numbered "3XX," such as the emitter 323 for transistor 23'; its base connection via numbered "4XX," such as the via 423 for transistor 23'; its selective emitter connection via numbered "4XX'," such as the via 423' for transistor 23'; its horizontal, programmable base connection line numbered "5XX," such as line 523 for transistor 23'; and its selective base input connection via numbered "6XX," such as via 623 for transistor 23'.

With regard to the structure of the DOT OR connections between consecutive word lines in FIGS. 4 through 8, the word line 60 has its common emitter line 107 connected through the via 106 to the vertical conductor segment 106' which is connected through the via 106" to the n-type epitaxial layer 62 which is the common collector for the word line 62. The word line 62 has its common emitter line 105 connected through the via 104 to the vertical conductor segment 104' which is connected through the via 104" to the n-type epitaxial layer 64 which is the common collector for the word line 64. The word line 64 has its common emitter line 103 connected through the via 102 to the vertical conductor segment 102' which is connected through the via 102" to the n-type epitaxial layer 66 which is the common collector for the word line 66. The word line 66 has its common emitter line 101 connected through the via 100 to the vertical conductor segment 100' which is connected through the via 100" to the n-type epitaxial layer 68 which is the common collector for the word line 68. The collector-follower output 108 in FIG. 4 is the n-type epitaxial layer 60 which is the common collector for the word line 60, and is connected through the via 108 to the output side of the load resistor 110 whose opposite side is connected to the collector voltage $V_{CC}$. The current source 99 of FIG. 4 is connected to the common emitter conductor 599 of the word line 68. The number of rows N and the number of columns M can be varied to suit the complex logic function and the number of reference voltages in a particular application. In this manner, a cascode connected PLA array is formed.

While the invention has been particularly shown and described with reference to the preferred embodiment thereof, it will be understood by those skilled in the art that the foregoing and other changes in form and detail may be made therein without departing from the spirit and scope of the invention.

Having thus described our invention, what we claim as new, and desired to secure by Letters Patent is:

1. A bipolar transistor integrated circuit comprising:
   a first horizontally elongated, isolated epitaxial region in a semiconductor substrate;
   a second horizontally elongated, isolated epitaxial region in said substrate;
   a first plurality of common collector bipolar transistors formed in a spaced, horizontal row in said first epitaxial region which forms the common collectors thereof, with selected ones of said plurality having their emitters connected in common to a first current source;

a second plurality of common collector bipolar transistors formed in a spaced, horizontal row in said second epitaxial region which forms the common collectors thereof, with selected ones of said second plurality having their emitters connected in common to said first epitaxial region and each of said second plurality of transistors being vertically aligned with a respective one of said first plurality of transistors;

the bases of said vertically aligned transistors from said first and said second epitaxial regions being selectively connected to vertically oriented input signal lines;

said second epitaxial region being connected to an output mode;

a third vertically elongated, isolated epitaxial region in said substrate;

a plurality of common collector bipolar transistors formed in a spaced, vertical row in said third epitaxial region which forms the common collectors thereof, with a first one of said plurality having its emitter connected in common with said emitters of said selected ones of said plurality of transistors in said first epitaxial region and being vertically aligned therewith, a second one of said plurality of transistors in said third epitaxial region having its emitter connected in common with said emitters of said selected ones of said second plurality of transistors in said second epitaxial region and being vertically aligned therewith;

said first one of said transistors in said third epitaxial region serving as a reference transistor for said selected ones of said plurality of transistors in said first epitaxial region, being connected in a current switched logic configuration;

said second one of said transistors in said third epitaxial region serving as a reference transistor for said selected ones of said second plurality of transistors in said second epitaxial region, connected in a current switched logic configuration;

whereby a cascode connected logic array is formed.

2. The bipolar transistor integrated circuit of claim 1, wherein said selected ones of said plurality of transistors formed in said first epitaxial region, further comprise:

a first transistor having its base connected to a first logical input;

a second transistor having its base connected to a second logical input;

said first and second transistors in said first epitaxial region being connected with said first one of said transistors in said third epitaxial region in a current switched logic configuration.

3. The bipolar transistor integrated circuit of claim 2, wherein said selected ones of said second plurality of transistors in said second epitaxial region, further comprises:

a third transistor having its base connected to a third logical input;

a fourth transistor having its base connected to a fourth logical input;

said third and fourth transistors in said second epitaxial region being connected with said second one of said transistors in said third epitaxial region in a current switched logic configuration.

4. The bipolar transistor integrated circuit of claim 3, which further comprises:

a load resistor connected between said output node and a collector voltage potential;

whereby said output node assumes a voltage magnitude approximately equal to said collector voltage potential when all of said selected ones of said plurality of transistors in said first epitaxial region are off or when all of said selected ones of said second plurality of transistors in said second epitaxial region are off.

5. An integrated circuit structure, comprising:

a plurality of at least N horizontal isolation regions of a first conductivity type formed in a semiconductor substrate, and arranged into vertically juxtaposed horizontal rows of a first periodicity;

a first plurality of base regions of a second conductivity type arranged into N horizontal rows of said first periodicity and M columns of a second periodicity, with each row of base regions formed in one of said plurality of horizontal isolation regions;

a vertical isolation region of said first conductivity type formed in said semiconductor substrate, oriented vertically and juxtaposed with the vertical sides of said plurality of horizontal isolation regions;

a second plurality of at least N base regions of said second conductivity type, each juxtaposed with a respective one of said plurality of horizontal isolation regions, arranged into a column, and formed in said vertical isolation region, each of said second plurality of base regions being electrically connected to one of N reference voltages;

a first plurality of emitter regions of said first conductivity type, each selectively formed in a respective selected one of said first plurality of base regions;

a second plurality of emitter regions of said first conductivity type, each formed in a respective one of said second plurality of base regions;

a plurality of horizontal, common emitter conducting lines formed at a first level above said substrate, each juxtaposed with a respective one of said plurality of horizontal isolation regions and electrically connecting a corresponding one of said second emitter regions in a juxtaposed one of said second plurality of base regions, to each one of a subplurality of said first plurality of emitter regions in said respective one of said plurality of horizontal isolation regions;

a plurality of horizontal, programmable base connection, conducting line segments formed at said first level above said substrate, each juxtaposed with and electrically connected to a respective one of said first plurality of base regions;

a plurality of M×N vertical conducting lines formed at a second level above said first level above said substrate, each subplurality of N adjacent ones thereof juxtaposed with ones of said plurality of horizontal base connections which are connected to ones of said first plurality of base connections arranged into one of said M columns, each respective vertical line in each of said subplurality of vertical conducting lines being electrically connected to a logic signal source providing logic signals referenced with respect to one of said N reference voltages;

said selected first base regions each having its respective horizontal base connections selectively electrically connected to that one of said N juxtaposed vertical conducting lines whose logic signals correspond to that one of said N reference voltages connected to that one of said second plurality of base regions juxtaposed therewith;

said plurality of horizontal isolation regions having a first one thereof connected to an output terminal and further connected through a load device to a collector voltage;

said plurality of horizontal isolation regions having a second one thereof, adjacent to said first one thereof, electrically connected as a logical DOT OR connection to that one of said plurality of common emitter conducting lines juxtaposed above said first one of said horizontal isolation regions;

said plurality of said horizontal isolation regions having an $N^{th}$ one thereof adjacent to an $N-1^{th}$ thereof, electrically connected as a logical DOT OR connection to that one of said plurality of common emitter conducting lines juxtaposed above said $N-1^{th}$ one of said horizontal isolation regions;

said plurality of common emitter conducting lines having that one thereof juxtaposed with said $N^{th}$ horizontal isolation region, connected to a current source;

whereby a complex logical function is formed.

6. The structure of claim 5, which further comprises:
each of said subplurality of vertical conducting lines being a logical input bit line and each of said horizontal isolation regions being a word line in a cascoded programmed logic array.

7. The structure of claim 5, which further comprises:
a second plurality of horizontal, programmable base connections, conducting line segments formed at said first level above said substrate, each juxtaposed with and electrically connected to a respective one of said second plurality of base regions;

a second plurality of N vertical conducting lines formed at a second level above said first level above said substrates, juxtaposed with said second plurality of horizontal base connections, each respective vertical line in each of said second plurality of vertical conducting lines being electrically connected to a respective one of said N reference voltages.

8. The structure of claim 5, wherein said first conductivity is n-type and said second conductivity is p-type.

9. The structure of claim 5, wherein said first conductivity is p-type and said second conductivity is n-type.

10. An integrated circuit structure, comprising:
a plurality of at least N horizontal isolation regions of a first conductivity type formed in a semiconductor substrate, and arranged into vertically juxtaposed horizontal rows, each being a common collector for a plurality of bipolar transistors formed therein;

a first plurality of base regions of a second conductivity type arranged into N horizontal rows and M columns with each rows of base regions formed in one of said plurality of horizontal isolation regions;

a reference isolation region of said first conductivity type formed in said semiconductor substrate proximate to said plurality of horizontal isolation regions, being a common collector for a plurality of bipolar transistors formed therein, and connected to a collector voltage;

a second plurality of at least N base regions of said second conductivity type, each corresponding to a respective one of said plurality of horizontal isolation regions and formed in said reference isolation region, each of said second plurality of base regions being electrically connected to one of N reference voltages;

a first plurality of emitter regions of said first conductivity type, each selectively formed in a respective selected one of said first plurality of base regions;

a second plurality of emitter regions of said first conductivity type, each formed in a respective one of said second plurality of base regions;

a plurality of horizontal, common emitter conducting lines formed at a first level above said substrate, each juxtaposed with a respective one of said plurality of horizontal isolation regions and electrically connecting a corresponding one of said second emitter regions in a corresponding one of said second plurality of base regions, to each one of a subplurality of said first plurality of emitter regions in said respective one of said plurality of horizontal isolation regions;

a plurality of horizontal, programmable base connection, conducting line segments formed at approximately said first level above said substrate, each juxtaposed with and electrically connected to a respective one of said first plurality of base regions;

a plurality of $M \times N$ vertical conducting lines formed at a second level above said first level above said substrate, each subplurality of N adjacent ones thereof juxtaposed with ones of said plurality of horizontal base connections which are connected to ones of said first plurality of base connections arranged into one of said M columns, each respective vertical line in each of said subplurality of vertical conducting lines being electrically connected to a logic signal source providing logic signals referenced with respect to one of said N reference voltages;

said selected first base regions having their respective horizontal base connections selectively electrically connected to that one of said N juxtaposed vertical conducting lines whose logic signals correspond to that one of said N reference voltages connected to that one of said N reference voltages connected to that one of said second plurality of base regions corresponding therewith;

said plurality of horizontal isolation regions having a first one thereof connected to an output terminal and further connected through a load device to a collector voltage;

said plurality of horizontal isolation regions having a second one thereof electrically connected as a logical DOT OR connection to that one of said plurality of common emitter conducting lines juxtaposed above said first one of said horizontal isolation regions;

said plurality of said horizontal isolation regions having an $N^{th}$ one thereof electrically connected as a logical DOT OR connection to that one of said plurality of common emitter conducting lines juxtaposed above an $N-1^{th}$ one of said horizontal isolation regions;

said plurality of common emitter conducting lines having that one thereof juxtaposed with said $N^{th}$ horizontal isolation region, connected to a current source;

whereby a complex logical function is formed in a cascode connected PLA array.

11. The structure of claim 10, which further comprises:

each of said subplurality of vertical conducting lines being a logical input bit line and each of said horizontal isolation regions being a word line in a cascoded programmed logic array.

12. The structure of claim 10, which further comprises:

a second plurality of horizontal, programmable base connection, conducting line segments formed at approximately said first level above said substrate, each juxtaposed with and electrically connected to a respective one of said second plurality of base regions;

a second plurality of N conducting lines formed at a second level above said first level above said substrates, juxtaposed with said second plurality of horizontal base connections, each respective line in each of said second plurality of conducting lines being electrically connected to a respective one of said N reference voltages.

13. The structure of claim 10, wherein said first conductivity is n-type and said second conductivity is p-type.

14. The structure of claim 10, wherein said first conductivity is p-type and said second conductivity is n-type.

* * * * *

United States Patent [19]

Aytac

[11] Patent Number: 4,518,875
[45] Date of Patent: May 21, 1985

[54] THREE-LEVEL MOS LOGIC CIRCUIT

[76] Inventor: Haluk M. Aytac, P.O. Box 10117, Berkeley, Calif. 94709

[21] Appl. No.: 534,269

[22] Filed: Sep. 22, 1983

Related U.S. Application Data

[63] Continuation-in-part of Ser. No. 385,072, Jun. 4, 1982, abandoned.

[51] Int. Cl.³ .................. H03K 19/20; H03K 19/094
[52] U.S. Cl. ...................................... 307/473; 307/451
[58] Field of Search ............... 307/451, 448, 464, 473, 307/474; 364/716

[56] References Cited

U.S. PATENT DOCUMENTS

| | | | |
|---|---|---|---|
| 3,949,242 | 4/1976 | Hirasawa et al. ................. | 307/473 |
| 3,950,656 | 4/1976 | Sumida et al. .................... | 307/473 X |
| 3,969,633 | 7/1976 | Paluck et al. ..................... | 307/473 |
| 4,029,971 | 6/1977 | Pryor ................................ | 307/473 |
| 4,037,114 | 7/1977 | Stewart et al. ................... | 307/473 |
| 4,202,044 | 5/1980 | Beilstein, Jr. et al. ........... | 307/474 X |
| 4,217,502 | 8/1980 | Suzuki et al. .................... | 307/473 |
| 4,280,065 | 7/1981 | Minato et al. .................... | 307/473 |
| 4,302,690 | 11/1981 | Gollinger et al. ............... | 307/473 X |
| 4,350,906 | 9/1982 | Gillberg .......................... | 307/473 X |

FOREIGN PATENT DOCUMENTS 1563821  4/1980  United Kingdom ............... 307/473

OTHER PUBLICATIONS

Dansky, "Multiple Threshold IGFET Ternary Circuits", IBM Tech. Disc. Bull., vol. 17, No. 5, Oct. 1974, pp. 1356-1357.

Smith, "The Prospects for Multivalued Logic: A Technology and Applications View", *IEEE Transactions on Computers,* vol. C-30, No. 9, Sep. 1981, pp. 619-634.

Primary Examiner—Stanley D. Miller
Assistant Examiner—David R. Hudspeth
Attorney, Agent, or Firm—Owen, Wickersham & Erickson

[57] ABSTRACT

A ternary logic circuit comprises a load element connected to one voltage level and to a node and a logic section connected to a second voltage level and the same node from which the circuit output is derived. The two voltage levels including the voltage supply and ground voltage enable the circuit to provide an output at three logic levels, "0", "1", and "2", depending on inputs to the logic section. The circuit may be implemented with CMOS technology using, in addition, N-channel or P-channel depletion devices, in different logic formats such as ternary extensions of NAND or NOR gate circuits with the logic section elements arranged in different configurations and combinations of pairs of CMOS devices.

8 Claims, 16 Drawing Figures

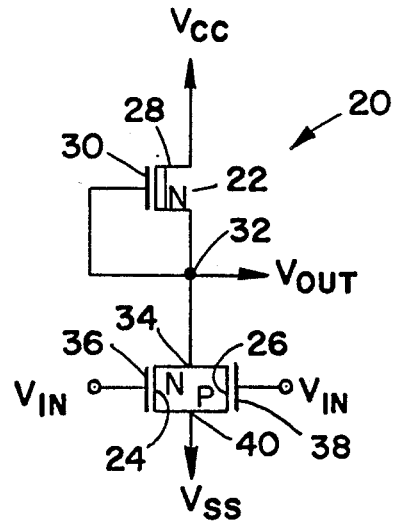

UNITED STATES PATENT AND TRADEMARK OFFICE
CERTIFICATE OF CORRECTION

PATENT NO. : 4,518,874
DATED : May 21, 1985
INVENTOR(S) : James W. Davis, et al

It is certified that error appears in the above-identified patent and that said Letters Patent is hereby corrected as shown below:

```
Column 11, line 19 - change "mode" to --node--.
Column 13, line 58 - change "rows" to --row--.
```

Signed and Sealed this

Third Day of September 1985

[SEAL]

Attest:

DONALD J. QUIGG

Attesting Officer   Acting Commissioner of Patents and Trademarks - Designate